(12) United States Patent
Trzasko et al.

(10) Patent No.: US 9,709,650 B2
(45) Date of Patent: Jul. 18, 2017

(54) METHOD FOR CALIBRATION-FREE LOCALLY LOW-RANK ENCOURAGING RECONSTRUCTION OF MAGNETIC RESONANCE IMAGES

(71) Applicant: MAYO FOUNDATION FOR MEDICAL EDUCATION AND RESEARCH, Rochester, MN (US)

(72) Inventors: Joshua D. Trzasko, Rochester, MN (US); Armando Manduca, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 346 days.

(21) Appl. No.: 14/356,287

(22) PCT Filed: Nov. 6, 2012

(86) PCT No.: PCT/US2012/063706
§ 371 (c)(1),
(2) Date: May 5, 2014

(87) PCT Pub. No.: WO2013/067546
PCT Pub. Date: May 10, 2013

(65) Prior Publication Data
US 2014/0286560 A1 Sep. 25, 2014

Related U.S. Application Data

(60) Provisional application No. 61/556,278, filed on Nov. 6, 2011.

(51) Int. Cl.
*G01R 33/561* (2006.01)

(52) U.S. Cl.
CPC ............... *G01R 33/5611* (2013.01)

(58) Field of Classification Search
None
See application file for complete search history.

(56) References Cited

U.S. PATENT DOCUMENTS 6,229,309 B1   5/2001  Aldefeld
7,642,777 B1 * 1/2010  Meyer .............. G01R 33/56563
                                                324/309

(Continued)

OTHER PUBLICATIONS

Lustig, M., Alley, M., Vasanawala, S., Donoho, D.L. and Pauly, J.M., Apr. 2009, L1 SPIR-iT: autocalibrating parallel imaging compressed sensing. In Proc Intl Soc Mag Reson Med (vol. 17, p. 379).*

(Continued)

*Primary Examiner* — Sumati Lefkowitz
*Assistant Examiner* — Carol Wang
(74) *Attorney, Agent, or Firm* — Quarles & Brady LLP (57) ABSTRACT

A method for reconstructing an image of a subject from multi-coil data acquired with an array of radio frequency ("RF") receiver coils that form a part of a magnetic resonance imaging ("MRI") system without the need for coil sensitivity calibration is provided. A coil data set is acquired for each of the RF receiver coils, for example, by undersampling k-space. A set of image blocks that defines the location and size of each of a plurality of image blocks in the image domain is then selected. The acquired coil data sets and selected image block set are then used to jointly estimate a coil image for each of the plurality of RF receiver coils while promoting locally-low rank structure in the coil images. These coil images are then combined to produce the target image of the subject.

28 Claims, 3 Drawing Sheets

(56) References Cited

U.S. PATENT DOCUMENTS

| | | | |
|---|---|---|---|
| 2007/0090839 A1* | 4/2007 | Vittorio | G01R 33/3415 324/309 |
| 2007/0096732 A1* | 5/2007 | Samsonov | G01R 33/5611 324/309 |
| 2008/0012562 A1* | 1/2008 | Beatty | G01R 33/5611 324/307 |
| 2008/0012566 A1* | 1/2008 | Pineda | G01R 33/5611 324/309 |
| 2008/0183067 A1* | 7/2008 | Shu | G01R 33/4824 600/410 |
| 2008/0197842 A1* | 8/2008 | Lustig | G01R 33/561 324/307 |
| 2008/0197844 A1 | 8/2008 | Ying et al. | |
| 2009/0012385 A1 | 1/2009 | Takizawa et al. | |
| 2009/0257629 A1 | 10/2009 | Fuderer | |
| 2009/0278539 A1* | 11/2009 | Beatty | A61B 5/055 324/312 |
| 2010/0308824 A1* | 12/2010 | Grady | G01R 33/5611 324/309 |
| 2011/0044546 A1* | 2/2011 | Pan | G06T 11/006 382/195 |
| 2011/0293158 A1* | 12/2011 | Popescu | A61B 5/055 382/131 |
| 2012/0099774 A1* | 4/2012 | Akcakaya | G06T 11/008 382/131 |

OTHER PUBLICATIONS

Blumensath, T. and Davies, M.E., 2010. Normalized iterative hard thresholding: Guaranteed stability and performance. IEEE Journal of selected topics in signal processing, 4(2), pp. 298-309.*
International Search Report and Written Opinion under date of Jan. 31, 2013 in connection with PCT/US2012/063706.
Majumdar et al., An algorithm for sparse MRI reconstruction by Schatten p-norm minimization. Magnetic Resonance Imaging pp. 408-417 [online], Apr. 2011. [Retrieved on Dec. 30, 2012]. Retrieved from the internet: <URL:http://www.mrijournal,com/article/SO730-725X(10)00273-O/abstract>, Abstract, p. 408, para. 1-3, p. 410, para 1-2, p. 411, para 1-4, 8, p. 412, para 4-5, 11-12, p. 413, para 4., p. 414, para 1.

* cited by examiner

METHOD FOR CALIBRATION-FREE LOCALLY LOW-RANK ENCOURAGING RECONSTRUCTION OF MAGNETIC RESONANCE IMAGES

CROSS-REFERENCE TO RELATED APPLICATIONS

This application represents the national stage entry of PCT International Application No. PCT/US2012/063706 filed Nov. 6, 2012, which claims priority to U.S. Provisional Patent Application Ser. No. 61/556,278 filed Nov. 6, 2011, the disclosures of which are hereby incorporated by reference in their entirety for all purposes.

BACKGROUND OF THE INVENTION

The field of the invention is systems and methods for magnetic resonance imaging ("MRI"). More particularly, the invention relates to systems and methods for parallel MRI image reconstruction.

Depending on the technique used, many MRI scans currently require many minutes to acquire the necessary data used to produce medical images. The reduction of this scan time is an important consideration, since reduced scan time increases patient throughput, improves patient comfort, and improves image quality by allowing for a reduction in subject motion artifacts. Many different strategies have been developed to shorten the scan time of MRI scans.

One such strategy is referred to generally as "parallel MRI" ("pMRI"). In general, pMRI techniques achieve a reduction in scan time by undersampling the data acquisition. For example, every other phase encoding step can be skipped in order to reduce scan time by a factor of two. In these instances, however, aliasing artifacts are introduced into images that are reconstructed with conventional image reconstruction techniques. To overcome these aliasing artifacts, pMRI techniques generally use spatial information from an array of radio frequency ("RF") receiver coils to substitute for the spatial encoding that would otherwise be provided by RF pulses and magnetic field gradients foregone in the pMRI technique.

Each of the spatially independent receiver coils of the coil array carries certain spatial information that can be identified by its unique spatial sensitivity profile. This information is utilized to achieve a complete spatial encoding of the received MR signals, for example, by combining the simultaneously acquired data received from each of the separate coils. As noted above, pMRI techniques allow an undersampling of k-space, typically by reducing the number of acquired phase-encoded k-space sampling lines, while keeping the maximal extent covered in k-space fixed. The combination of the separate MR signals produced by the separate receiver coils enables a reduction of the acquisition time required for an image as compared to the time required for a conventional k-space data acquisition. This "acceleration" is related to the number of the receiver coils in the coil array. Thus, the use of multiple receiver coils acts to accelerate imaging speed, without increasing gradient switching rates or RF power.

Two categories of exemplary pMRI techniques include those methods that generate a single image from a multi-coil data set, and those methods that generate an image for each coil in the coil array. Single image reconstruction methods include the method known in the art as sensitivity encoding ("SENSE"), which seeks to estimate the underlying image common to all coil receivers. Such techniques, while statistically efficient, require explicit knowledge of the spatial sensitivity functions for each coil sensor. Typically, sensitivity functions are estimated using a separate "calibration" scan that lengthens the exam, is challenging to perform in dynamic applications, and unavoidably propagates error into the reconstructed images.

Coil-by-coil methods include those known in the art as simultaneous acquisition of spatial harmonics ("SMASH") and generalized autocalibrating partially parallel acquisitions ("GRAPPA"). With GRAPPA, k-space lines near the center of k-space are sampled at the Nyquist frequency, while k-space lines in the peripheral regions of k-space are acquired with a degree of undersampling. The center k-space lines are referred to as so-called autocalibration signal ("ACS") lines, which are used to determine weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

In lieu of explicit sensitivity information, methods such as GRAPPA learn inter-coil correlations from the ACS lines and use this information to jointly reconstruct all coil images. In practice, coil-by-coil methods are often more robust and versatile than single image reconstruction strategies; however, most coil-by-coil methods require the explicit formation of an inter-coil correlation function that can lead to error propagation, and may limit their applicability to acquisitions with special structured sampling patterns.

Parallel imaging is a widely used strategy for accelerating MRI acquisitions. Auto-calibrated coil-by-coil methods, such as GRAPPA, have become increasingly popular because they do not require a separate calibration scan, like SENSE does, nor do they require an explicit estimation of coil sensitivity profiles. These features make auto-calibrated pMRI techniques attractive for time-limited and dynamic applications like cardiac imaging. However, auto-calibrated pMRI techniques still typically require the explicit formation of a mathematical operator that describes intercoil correlations. Because this operator must itself be estimated from the measured data, its use during reconstruction unavoidably propagates error into the final generated images. Moreover, auto-calibration techniques inherently comprise a joint estimation of both the target images and the system model (e.g., the GRAPPA kernel). This joint-estimation corresponds to a challenging bilinear optimization problem, in which effort is spent to explicitly estimate the system model that is ultimately discarded post-reconstruction.

In an attempt to circumvent these foregoing problems with auto-calibration techniques, M. Lustig et al., proposed a method for coil-by-coil reconstruction of phased-array MRI data using a global Fourier-domain low-rank matrix completion technique, as described in "Calibration Parallel Imaging by Structured Low-Rank Matrix Completion," *Proc. of the ISMRM*, 2010; 2870. This reconstruction technique exploits the tendency of a Hankel matrix formed by stacking rasterizations of small k-space blocks to be low-rank. This technique, however, has limited scalability. For example, the memory footprint of the constructed Hankel matrix can be well over an order of magnitude larger than that of the target image set, and performing singular value decompositions on such large matrices is computationally challenging. Also, the generalization of this k-space approach to incorporating physical signal models, such as the Dixon model for fat-water separation techniques, is not straightforward.

SUMMARY OF THE INVENTION

The present invention overcomes the aforementioned drawbacks by providing a method for calibration-free, locally low-rank encouraging reconstruction ("CLEAR") of magnetic resonance images.

It is an aspect of the invention to provide a method for reconstructing an image from data acquired with a plurality of radio frequency ("RF") receiver coils that form a part of a magnetic resonance imaging ("MRI") system. A coil data set is acquired from the subject for each of the plurality of RF receiver coils. A set of image blocks that defines the location and size of each of a plurality of image blocks in the image domain is then selected and used along with the acquired coil data sets to produce coil images. Coil image for each of the plurality of RF receiver coils are jointly estimated in a manner that promotes locally low-rank structure in the coil images. The estimated coil images are then combined to produce the image of the subject. By way of example, the joint estimation of the coil images includes minimizing an objective function while promoting locally low-rank structure in the jointly estimated coil images. For example, locally low-rank structure may be promoted by imposing a penalty factor that penalizes structure that is not locally low rank. By way of example, such a penalty factor may include the calculation of a singular value soft-threshold for each image block.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

The present invention provides a method for calibration-free reconstruction of images from data acquired using a pMRI technique. This method yields several advantages over previous Fourier domain approaches. For example, because the image reconstruction migrates the imposition of desired image properties out of the data observation (Fourier) domain, mathematically consistent adaptations of this technique for generalized or physics-based signal models, such as the Dixon model for fat-water separation techniques; non-Cartesian data acquisitions; and use of auxiliary spatial penalties is straightforward. The method is also based on local image characteristics, which allows the replacement of a single extremely large matrix decomposition with many smaller, easily parallelizable decompositions. This latter feature eases the extension of the image reconstruction technique to three-dimensional imaging, dynamic imaging, and other large-scale or high-dimensional clinical applications.

By way of example, in pMRI data acquisitions, the signal, $g_c$, observed by the $c^{th}$, $c=1, \ldots, C$, receiver coil may be modeled as:

$$g_c = A(s_c \cdot f) + n_c \quad (1)$$
$$= Af_c + n_c;$$

where f is the underlying complex target signal, which has a length of N; $s_c$ is the sensitivity function for the $c^{th}$ receiver coil; A is an N→K Fourier-based sampling operator; and $n_c$ is complex Gaussian noise. The functional operator, A, is commonly termed the "forward signal model" as it models the physical process that a signal undergoes during MRI acquisition. The forward model can, of course, be defined to include both primary and secondary magnetic resonance physical phenomena. By way of example, in accelerated fat-water separation imaging, the operator, A, may be defined to include the effects of both Fourier encoding, as well as off-resonance and species-specific chemical shift in a manner analogous to that used in standard non-accelerated Dixon imaging. Data corrupted by correlated noise may be handled directly, or may be pre-whitened. When the coil sensitivity is known, the image, f, can be directly estimated, such as by way of a least squares regression. This is the approach used for single image reconstruction techniques. However, if the coil sensitivity is not explicitly known, it can be combined with the image, f, to yield a different variable, $f_c$, for each receiver coil. This is the approach used for coil-by-coil reconstruction techniques.

Coil sensitivity functions are inherently smooth, a property that is often exploited when the coil sensitivity functions are explicitly estimated. This property is advantageously utilized by the method of the present invention, even if only implicitly. Image blocks can be chosen to have isotropic or anisotropic dimensions. Considering an arbitrary B×B, B<<N, image block that is extracted from one coil image, the sensitivity component of this image block may be modeled using a low-order approximation, such as a low-order polynomial. Correspondingly, a $B^2 \times C$ matrix formed by rasterizing and stacking those image blocks from the same spatial location from each receiver coil will be a low-rank matrix. The method of the present invention promotes such a locally low-rank structure in the image domain, while separately maintaining fidelity to the measured data in the Fourier domain.

By way of example, suppose the signal elements of Eqn. (1) are arranged as follows:

$$F = [vec(f_0) | \ldots | vec(f_{c-1})] \quad (2);$$

and $$G = [vec(g_0) | \ldots | vec(g_{c-1})] \quad (3);$$

where F is an N×C matrix, and G is a K×C matrix. Letting $R_b$ define a $B^2 \times N$ binary block selection operator for the $b^{th}$ image block, the image matrix, F, can be estimated from the data matrix, G, by solving an optimization that promotes locally low-rank structure, such as the following minimization problem:

$$F \approx \underset{x}{\mathrm{argmin}}\left\{\alpha \sum_{b\in\Omega} \mathrm{Rank}(R_b X) + \|AX - G\|_F^2\right\}; \quad (4)$$

where X is an N×C complex matrix; α is a regularization parameter; Ω is the set of all N image blocks, and $\|\ldots\|_F$ is the Frobenius norm, which has the form:

$$\|x\|_F = \sqrt{\sum_{i=1}^m \sum_{j=1}^n |x_{ij}|^2}. \quad (5)$$

Functional minimization of a metric, such as the Frobenius norm, of the difference between the measured k-space data, G, and the signal generated by projecting the estimated image set, X, through the forward operator, A, encourages this difference to be small and, therefore, promotes data fidelity. Thus, this functional component of Eqn. (4) may be referred to as a "data fidelity" term.

The image block set, Ω, will cover the entire image domain, and blocks contained therein may overlap to introduce an auxiliary source of redundancy into the reconstruction process. By way of example, the image block set, Ω, may be defined to contain one B×B image block for each voxel location in the target image domain under periodic boundary conditions. During iterative reconstruction, the spatial location of this block set may also be spatially shifted by a random or deterministic amount at different points in the iteration to simulate translation invariance. By way of example, the image block set, Ω, may be defined to contain B×B image blocks spaced B voxels apart such that they do not spatially overlap. In this instance, the exact location of this block set in the image domain may change by a random offset at each iteration during the iterative reconstruction.

It is important to note that no sensitivity functions or inter-coil correlation operators appear explicitly anywhere in Eqn. (4). Because Eqn. (4) is NP-hard, greedy optimization methods may be employed to solve this problem. For example, a singular value hard thresholding technique may be used. Alternatively, the rank measure, Rank( . . . ), may be replaced by any continuous, but not necessarily differentiable, or convex spectral function. Some examples of penalty terms that may be incorporated into the optimization problem include non-convex penalty terms that may include a log-determinant or a Schatten p-norm functional. As another example, the rank measure may be replaced by its convex envelope, the nuclear norm operator, $\|\ldots\|_*$, which is defined as the sum of the singular values of the target matrix, as follows:

$$\|x\|_* = \mathrm{trace}(\sqrt{x^*x}) = \sum_{i=1}^{\min(m,n)} \sigma_i. \quad (6)$$

Replacing the rank measure in Eqn. (4) with the nuclear norm yields the following minimization problem:

$$F \approx \underset{x}{\mathrm{argmin}}\left\{\alpha \sum_{b\in\Omega} \|R_b X\|_* + \|AX - G\|_F^2\right\}. \quad (7)$$

In sparsity-driven applications like compressed sensing ("CS"), the convex $\lambda_1$-norm is often employed as a surrogate for the non-convex $\lambda_0$-norm. The relaxation of the rank measure to the nuclear norm may be viewed as an analogous relaxation. Minimizers of Eqn. (7) can be identified using convex optimization strategies. By way of example, a matrix generalization of Nesterov's optimal gradient method, such as the one described by K. Toh and S. Yun, in "An Accelerated Proximal Gradient Algorithm for Nuclear Norm Regularized Least Squares Problems," *Pad J Opt,* 2010; 6:615-640, may be employed.

By way of example, Eqn. (7) may be minimized using an iterative technique that will be described below in detail. Each iteration of this example technique for minimizing Eqn. (7) includes a first-order update of the objective function in Eqn. (7), and an application of a projection operator that promotes local low rankedness:

$$P(X) = \frac{1}{B^2} \sum_{b\in\Omega} R_b^* \cdot S_\lambda(R_b X); \quad (8)$$

where $S_\lambda(\ldots)$ is a singular value soft-thresholding operator, such as the one described by J. Cai, et al., "A Singular Value Thresholding Algorithm for Matrix Completion," *SIAM J Opt,* 2010. Whereas the k-space approach of Lustig, et al., described above is based on the singular value decomposition of a single, large matrix, Eqn. (8) is based on the singular value decomposition of many small matrices, which provides improved computational efficiency. Despite the additional 2·C Fourier operations in the first-order update, a per-iteration count of floating point operations ("FLOPS") reveals that the proposed image domain technique of the present invention is computationally advantageous, especially in the limit of increasing number of receiver coils. The memory footprint needed to compute Eqn. (8) is only on the order of the target image, which is significantly smaller than that of the previously mentioned k-space approach.

It is important to note also that the method of the present invention is also very amenable to implementation on modern hardware like GPU. By way of example, when the block set, Ω, is defined to contain spatially overlapping blocks, collision-free parallelization of Eqn. (8) can be obtained by noting that the image block set, Ω, includes subsets of disjoint image blocks.

Because Eqn. (7) exploits properties of the receiver system, for improved reconstruction performance the method of the present invention can also be generalized to include auxiliary penalty terms that promote other desirable properties about the image that is to be reconstructed, such as sparsity following mathematical transformation. By way of example, sparsity can be promoted in a block-wise fashion, as well as jointly across receiver coils, by modifying Eqn. (7) as follows:

$$F \approx \underset{x}{\mathrm{argmin}}\left\{\beta \sum_{b\in\Omega} \|\Psi R_b X\|_{1,2} + \alpha \sum_{b\in\Omega} \|R_b X\|_* + \|AX - G\|_F^2\right\}; \quad (9)$$

where β is a regularization parameter; Ψ is an orthonormal sparsifying transform; and $\|\ldots\|_{1,2}$ is selected as one of the $\lambda_1$-norm or the $\lambda_2$-norm. In general, the $\lambda_p$-norm of an m×n matrix, x, is given as:

$$\|x\|_p = \left(\sum_{i=1}^{m}\sum_{j=1}^{n}|x_{ij}|^p\right)^{1/p}. \qquad (10)$$

Examples of sparsifying transforms, $\Psi$, include without limitation the discrete cosine transform, the wavelet transform, and empirically-derived dictionaries. Eqn. (9) may be solved using a method such as the projections-onto-convex-sets ("POCS") technique, variable splitting technique, augmented Lagrangian methods, or by a multi-penalty generalization of FISTA as described by Huang, et al., in "Efficient MR Image Reconstruction for Compressed Sensing MRI," *Med Img Anal,* 2011. For the latter technique, Eqn. (8) may be modified as:

$$P(X) = \frac{1}{B^2}\sum_{b\in\Omega}R_b^*\left(\frac{1}{2}S_\lambda(R_b X) + \frac{1}{2}\Psi^* T_\gamma(\Psi R_b X)\right); \qquad (11)$$

where $T_\gamma(\ldots)$ is a joint soft-thresholding operator, such as the one described by M. Lustig, et al., in "$L_1$-SPIRiT: Autocalibrating Parallel Imaging Compressed Sensing," *Proc. of the ISMRM,* 2009; 379.

Figure 1:
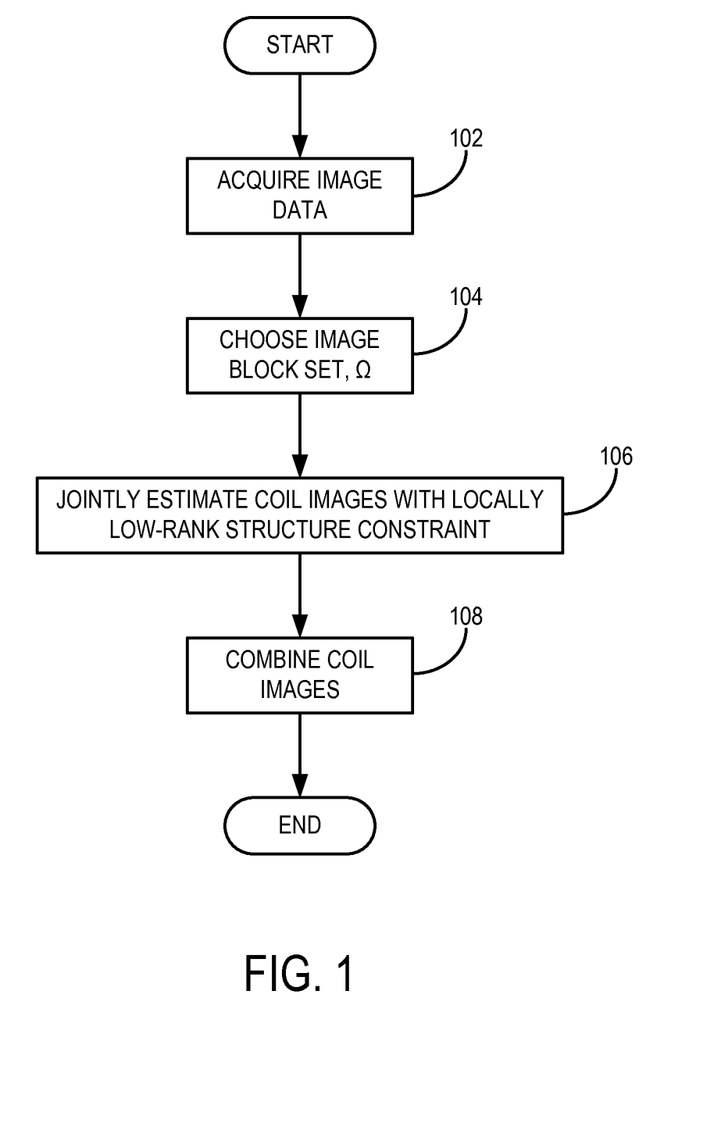
FIG. 1 is a flowchart setting forth the steps of an example of a method for calibration-free reconstruction of magnetic resonance images from a multi-coil image data set.

Referring now to FIG. 1, a flowchart setting forth the steps of an example of a method for calibration-free locally low-rank encouraging reconstruction ("CLEAR") of magnetic resonance images is illustrated. The method begins with The method begins with the acquisition of image data, as indicated at step 102. By way of example, image data is acquired using an array of receiver coils. Preferably, image data is acquired while undersampling k-space, thereby realizing an acceleration of the data acquisition process. As with compressed sensing applications, the method of the present invention will benefit when the sampling operator relied upon for data acquisition exhibits an incoherent point spread function; thus, by way of example, incoherent sampling, such as that achieved using a two-dimensional variable density random sampling, may be used during data acquisition.

A set of image blocks, $\Omega$, is chosen, as indicated at step 104. By way of example, the set of image blocks contains the location and size of a plurality of isotropically or anisotropically sized image blocks distributed in the image domain. For example, the set of image blocks may include a B×B sized image block centered at each voxel location in the image domain. Advantageously, the image blocks may overlap in the image domain. As an example, B may be selected as B=8. Using the acquired image data and the chosen image block set, an image estimate is reconstructed by minimizing an objective function that promotes locally-low rank structure in the reconstructed coil images, as indicated at step 106, and as described above in detail. In this manner, the coil images, $f_c$, are jointly estimated. As discussed above, the joint estimation of the coil images is constrained to promote locally low-rank structure therein. Moreover, the joint estimation of the coil images may also be constrained to promote image sparsity. During iterative reconstruction, the set of image blocks may remain static or can be spatially translated by a random or deterministic amount at each iteration. These coil images may then be combined using known techniques to produce a target image of the subject under examination, as indicated at step 108.

Figure 2:
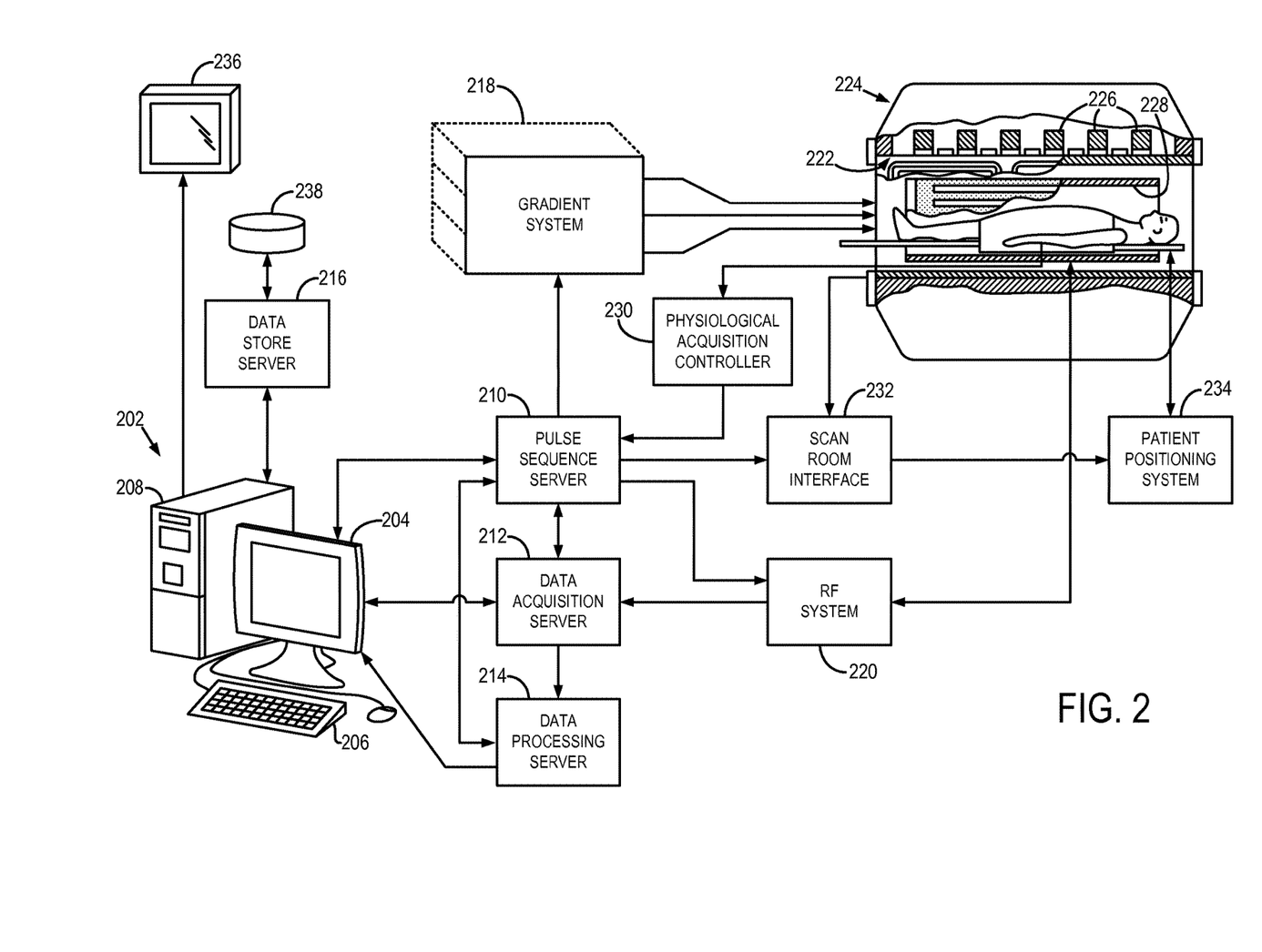
FIG. 2 is a block diagram of an example of a magnetic resonance imaging ("MRI") system.

Referring particularly now to FIG. 2, an example of a magnetic resonance imaging ("MRI") system 200 is illustrated. The MRI system 200 includes a workstation 202 having a display 204 and a keyboard 206. The workstation 202 includes a processor 208, such as a commercially available programmable machine running a commercially available operating system. The workstation 202 provides the operator interface that enables scan prescriptions to be entered into the MRI system 200. The workstation 202 is coupled to four servers: a pulse sequence server 210; a data acquisition server 212; a data processing server 214; and a data store server 216. The workstation 202 and each server 210, 212, 214, and 216 are connected to communicate with each other.

The pulse sequence server 210 functions in response to instructions downloaded from the workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding MR signals. The gradient coil assembly 222 forms part of a magnet assembly 224 that includes a polarizing magnet 226 and a whole-body RF coil 228.

RF excitation waveforms are applied to the RF coil 228, or a separate local coil (not shown in FIG. 2), by the RF system 220 to perform the prescribed magnetic resonance pulse sequence. Responsive MR signals detected by the RF coil 228, or a separate local coil (not shown in FIG. 2), are received by the RF system 220, amplified, demodulated, filtered, and digitized under direction of commands produced by the pulse sequence server 210. The RF system 220 includes an RF transmitter for producing a wide variety of RF pulses used in MR pulse sequences. The RF transmitter is responsive to the scan prescription and direction from the pulse sequence server 210 to produce RF pulses of the desired frequency, phase, and pulse amplitude waveform. The generated RF pulses may be applied to the whole body RF coil 228 or to one or more local coils or coil arrays (not shown in FIG. 2).

The RF system 220 also includes one or more RF receiver channels. Each RF receiver channel includes an RF amplifier that amplifies the MR signal received by the coil 228 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (12);$$

and the phase of the received MR signal may also be determined:

$$\varphi = \tan^{-1}\left(\frac{Q}{I}\right). \qquad (13)$$

The pulse sequence server 210 also optionally receives patient data from a physiological acquisition controller 230. The controller 230 receives signals from a number of different sensors connected to the patient, such as electrocardiograph ("ECG") signals from electrodes, or respiratory signals from a bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized MR signal samples produced by the RF system 220 are received by the data acquisition server 212. The data acquisition server 212 operates in response to instructions downloaded from the workstation 202 to receive the real-time MR data and provide buffer storage, such that no data is lost by data overrun. In some scans, the data acquisition server 212 does little more than pass the acquired MR data to the data processor server 214. However, in scans that require information derived from acquired MR data to control the further performance of the scan, the data acquisition server 212 is programmed to produce such information and convey it to the pulse sequence server 210. For example, during prescans, MR data is acquired and used to calibrate the pulse sequence performed by the pulse sequence server 210. Also, navigator signals may be acquired during a scan and used to adjust the operating parameters of the RF system 220 or the gradient system 218, or to control the view order in which k-space is sampled. The data acquisition server 212 may also be employed to process MR signals used to detect the arrival of contrast agent in a magnetic resonance angiography ("MRA") scan. In all these examples, the data acquisition server 212 acquires MR data and processes it in real-time to produce information that is used to control the scan.

The data processing server 214 receives MR data from the data acquisition server 212 and processes it in accordance with instructions downloaded from the workstation 202. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 214 are conveyed back to the workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the workstation 202. The workstation 202 may be used by an operator to archive the images, produce films, or send the images via a network to other facilities.

Figure 3:
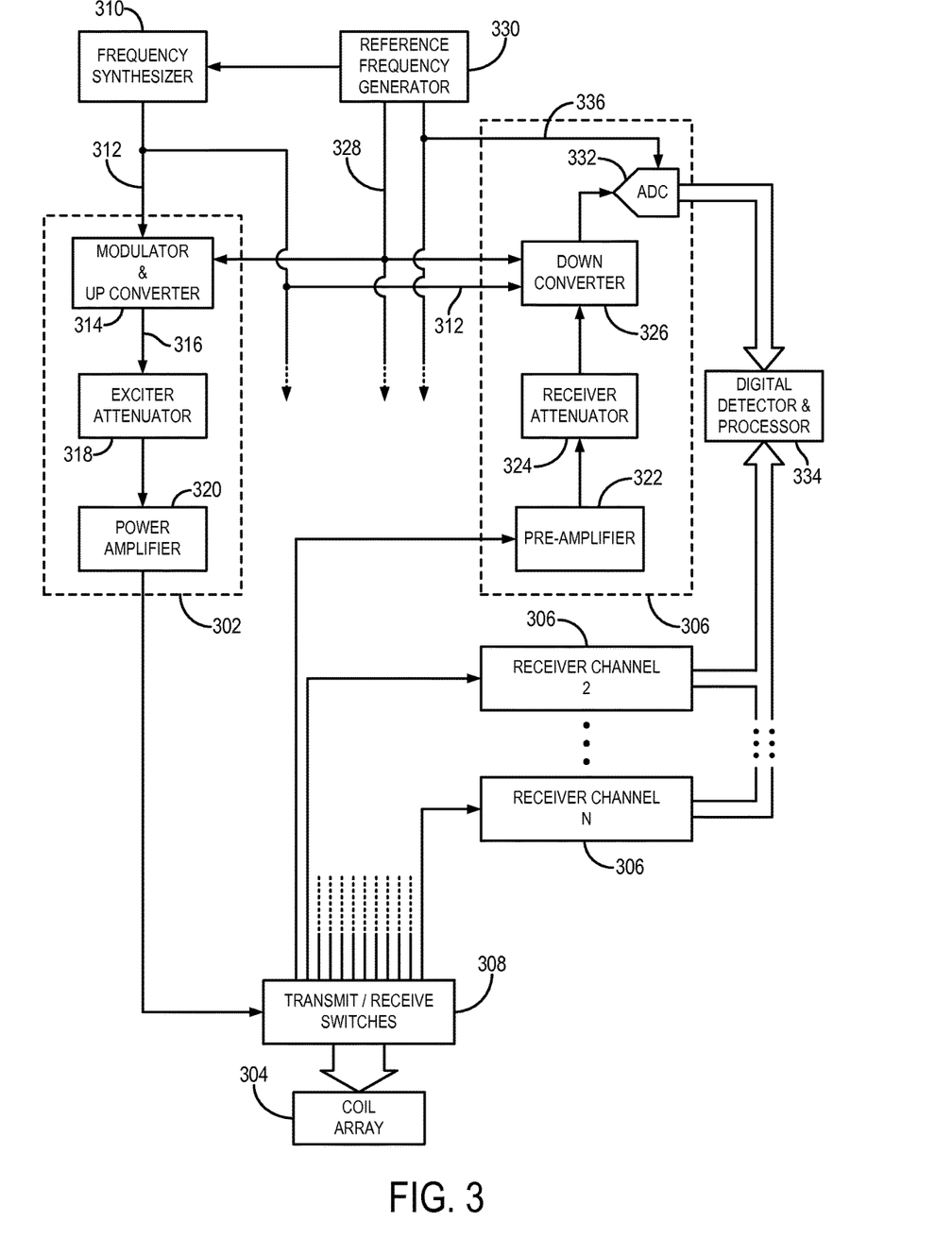
FIG. 3 is a block diagram of an example of a radio frequency system that forms a part of the MRI system of FIG. 2.

As shown in FIG. 2, the radiofrequency ("RF") system 220 may be connected to the whole body RF coil 228, or as shown in FIG. 3, a transmitter section of the RF system 220 may connect to at least one transmit channel 300 of a coil array 302, and its receiver section may connect to at least one receiver channel 304 of the coil array 302. Often, the transmitter section is connected to the whole body RF coil 228 or a local transmit coil (not shown), and, in so-called "parallel receiver" coil arrays, each receiver section is connected to a separate receiver channel 304.

Referring particularly to FIG. 3, the RF system 220 includes a transmitter that produces a prescribed RF excitation field. The base, or carrier, frequency of this RF excitation field is produced under control of a frequency synthesizer 306 that receives a set of digital signals from the pulse sequence server 210. These digital signals indicate the frequency and phase of the RF carrier signal produced at an output 308. The RF carrier is applied to a modulator and up converter 310 where its amplitude is modulated in response to a signal, R(t), also received from the pulse sequence server 210. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 312 is attenuated by an exciter attenuator circuit 314 that receives a digital command from the pulse sequence server 210. The attenuated RF excitation pulses are applied to a power amplifier 316, which drives the RF coil array 302 through a transmit/receive ("T/R") switch 318.

Referring still to FIG. 3, the signal produced by the subject is picked up by the coil array 302 and applied to the inputs of a set of receiver channels 304. A pre-amplifier 320 in each receiver channel 304 amplifies the signal by an amount determined by a digital attenuation signal received from the pulse sequence server 210. The received signal is at or around the Larmor frequency, and this high frequency signal is down-converted in a two step process by a down converter 322, which first mixes the detected signal with the carrier signal on line 308 and then mixes the resulting difference signal with a reference signal on line 324. The down converted MR signal is applied to the input of an analog-to-digital ("A/D") converter 326 that samples and digitizes the analog signal and applies it to a digital detector and signal processor 328 that produces 16-bit in-phase (I) values and 16-bit quadrature (Q) values corresponding to the received signal. The resulting stream of digitized I and Q values of the received signal are output to the data acquisition server 212. The reference signal, as well as the sampling signal applied to the A/D converter 326, are produced by a reference frequency generator 330.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image from data acquired with a plurality of radio frequency ("RF") receiver coils that form a part of a magnetic resonance imaging ("MRI") system, the steps of the method comprising:
   a) acquiring a coil data set from a subject for each of a plurality of RF receiver coils that form a part of an MRI system;
   b) selecting a set of image blocks that defines a location and size of each of a plurality of image blocks in an image domain;
   c) jointly estimating a coil image for each of the plurality of RF receiver coils using the coil data sets acquired in step a) and the set of image blocks selected in step b); and
   d) combining the coil images jointly estimated in step c) to produce the image of the subject.

2. The method as recited in claim 1 in which the joint estimation performed in step c) includes minimizing an objective function while promoting locally-low rank structure in the jointly estimated coil images using the set of image blocks selected in step b).

3. The method as recited in claim 2 in which step c) includes minimizing the objective function using a greedy optimization algorithm that is based on singular value hard thresholding.

4. The method as recited in claim 2 in which the set of image blocks is spatially translated by at least one of a random and a deterministic amount at each iteration of the minimization of the objective function.

5. The method as recited in claim 2 in which the objective function includes a non-convex penalty term that promotes locally low-rank structure in the jointly estimated coil images.

6. The method as recited in claim 5 in which the non-convex penalty term includes at least one of a log-determinant and a Schatten p-norm functional.

7. The method as recited in claim 2 in which the objective function includes a regularization parameter that is automatically selected using a statistical method.

8. The method as recited in claim 2 in which the objective function includes a term that promotes locally low-rank structure in the jointly estimated coil images using the set of image blocks selected in step b).

9. The method as recited in claim 8 in which the term of the objective function includes calculating a nuclear norm of each image block defined by the set of images blocks selected in step b) and summing the calculated nuclear norms.

10. The method as recited in claim 2 in which locally-low rank structure in the jointly estimated coil images is promoted by imposing a penalty factor that penalizes non-low-rank image blocks in the set of image blocks selected in step b).

11. The method as recited in claim 10 in which the penalty factor includes calculating a singular value soft threshold for each image block in the set of image blocks selected in step b).

12. The method as recited in claim 2 in which the objective function has at least one additional term that promotes desired spatial characteristics of the jointly estimated coil images.

13. The method as recited in claim 2 in which the objective function has at least one additional term that promotes sparsity in the jointly estimated coil images.

14. The method as recited in claim 13 in which the at least one additional term includes a sparsifying transform.

15. The method as recited in claim 14 in which the at least one additional term of the objective function includes producing sparsified image blocks by applying the sparsifying transform to each image block defined by the set of images blocks selected in step b), calculating an $\lambda_p$-$\lambda_q$ norm of each sparsified image block, and summing the calculated $\lambda_p$-$\lambda_q$ norms.

16. The method as recited in claim 2 in which the joint estimation performed in step c) includes minimizing an objective function while also promoting sparsity of the jointly estimated coil images using the set of image blocks selected in step b).

17. The method as recited in claim 16 in which sparsity of the jointly estimated coil images is promoted in step c) by imposing a penalty factor that penalizes non-sparse image blocks in the set of image blocks selected in step b).

18. The method as recited in claim 17 in which the penalty factor includes producing sparsified image blocks by applying the sparsifying transform to each image block defined by the set of images blocks selected in step b), and calculating a joint-soft threshold for each sparsified image block.

19. The method as recited in claim 18 in which the sparsifying transform is at least one of a discrete cosine transform and a wavelet transform.

20. The method as recited in claim 1 in which each coil data set acquired in step a) is acquired by undersampling k-space.

21. The method as recited in claim 20 in which step a) includes undersampling k-space using an incoherent sampling operation.

22. The method as recited in claim 20 in which step a) includes undersampling k-space using non-Cartesian trajectories.

23. The method as recited in claim 1 in which the image produced in step d) is a three-dimensional image, and the set of image blocks selected in step b) is a set of three-dimensional image blocks.

24. The method as recited in claim 1 in which the joint estimation performed in step c) includes using a forward signal model that accounts for at least one of off-resonance, concomitant gradients, chemical shifts, and presence of multiple chemical species.

25. The method as recited in claim 1 in which the joint estimation performed in step c) includes modeling complex Gaussian noise.

26. The method as recited in claim 25 in which the modeled complex Gaussian noise is modeled as at least one of correlated and uncorrelated across the plurality of RF receiver coils.

27. The method as recited in claim 1 in which:
the coil data set acquired in step a) is indicative of at least one of a time series of images and a parametric series of images;
the set of image blocks selected in step b) are obtained from different frames of the at least one of a time series of images and a parametric series of images; and
the joint estimation performed in step c) includes promoting low-rankedness across the set of image blocks selected in step b).

28. The method as recited in claim 1 in which the joint estimation performed in step c) includes minimizing an objective function that does not require coil sensitivity calibration data as an input.

* * * * *

UNITED STATES PATENT AND TRADEMARK OFFICE
CERTIFICATE OF CORRECTION

PATENT NO. : 9,709,650 B2  
APPLICATION NO. : 14/356287  
DATED : July 18, 2017  
INVENTOR(S) : Joshua D Trzasko It is certified that error appears in the above-identified patent and that said Letters Patent is hereby corrected as shown below:

In the Specification

Column 5, Line 67, "$\lambda_1$" should be --$\ell_1$--.

Column 6, Line 1, "$\lambda_0$" should be --$\ell_0$--.

Column 6, Line 8, "Pad" should be --Pac--.

Column 6, Line 66, "$\lambda_1$" should be --$\ell_1$--.

Column 6, Line 66, "$\lambda_2$" should be --$\ell_2$--.

Column 6, Line 66, "$\lambda_p$" should be --$\ell_p$--.

In the Claims

Column 11, Claim 15, Line 51, "$\lambda_p$-$\lambda_q$" should be --$\ell_p$-$\ell_q$--.

Column 11, Claim 15, Line 52, "$\lambda_p$-$\lambda_q$" should be --$\ell_p$-$\ell_q$--.

Signed and Sealed this  
Twenty-third Day of January, 2018

Joseph Matal  
*Performing the Functions and Duties of the  
Under Secretary of Commerce for Intellectual Property and  
Director of the United States Patent and Trademark Office*